United States Patent
Pabla et al.

(10) Patent No.: US 10,514,170 B2
(45) Date of Patent: *Dec. 24, 2019

(54) TREATMENT PROCESS, REJUVENATION PROCESS, TREATMENT COMPOSITION, AND TREATED COMPONENT

(71) Applicant: GENERAL ELECTRIC COMPANY, Schenectady, NY (US)

(72) Inventors: Surinder Singh Pabla, Greer, SC (US); Richard Todd Everhart, Simpsonville, SC (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 864 days.

This patent is subject to a terminal disclaimer.

(21) Appl. No.: 14/973,935

(22) Filed: Dec. 18, 2015

(65) Prior Publication Data
US 2017/0080458 A1 Mar. 23, 2017

Related U.S. Application Data

(63) Continuation-in-part of application No. 14/857,912, filed on Sep. 18, 2015, now Pat. No. 9,970,305.

(51) Int. Cl.
F23R 3/00 (2006.01)

(52) U.S. Cl.
CPC .............. *F23R 3/007* (2013.01); *F23R 3/002* (2013.01)

(58) Field of Classification Search
None
See application file for complete search history.

(56) References Cited

U.S. PATENT DOCUMENTS 2,786,779 A 3/1957 Long et al.
3,181,964 A 5/1965 Kramer et al.
(Continued)

FOREIGN PATENT DOCUMENTS

EP 2503027 A1 9/2012

OTHER PUBLICATIONS

European Search Report and Opinion issued in connection with corresponding European Application No. 16189238.5 dated Feb. 3, 2017.
(Continued)

*Primary Examiner* — Peter A Salamon
(74) *Attorney, Agent, or Firm* — McNees Wallace & Nurick LLC

(57) ABSTRACT

A treatment composition is disclosed including a carrier and a sacrificial oxide-forming material suspended within the carrier. The sacrificial oxide-forming material is selected from the group consisting of tin oxide, magnesium oxide, antimony pentaoxide, and combinations thereof. A treatment process for a gas turbine component including an abradable ceramic coating is disclosed. The process includes contacting the abradable ceramic coating with the treatment composition. The sacrificial oxide-forming material is infused into the abradable ceramic coating to form sacrificial oxide-forming deposits within the abradable ceramic coating. A rejuvenation process is disclosed including contacting the hot gas path surface of a gas turbine component with a rinse composition comprising water and the treatment composition to form the sacrificial oxide-forming deposits within the abradable ceramic coating.

17 Claims, 3 Drawing Sheets

(56) References Cited

U.S. PATENT DOCUMENTS

| | | | |
|---|---|---|---|
| 5,060,913 A | 10/1991 | Reid | |
| 6,413,578 B1 * | 7/2002 | Stowell | C23C 24/08 |
| | | | 427/142 |
| 6,953,603 B2 * | 10/2005 | Nonninger | C03C 17/007 |
| | | | 427/226 |
| 2003/0203210 A1 * | 10/2003 | Graff | H01L 51/0097 |
| | | | 428/412 |
| 2007/0184204 A1 * | 8/2007 | Balagopal | C23C 2/02 |
| | | | 427/419.2 |
| 2007/0202269 A1 * | 8/2007 | Potter | C23C 4/02 |
| | | | 427/446 |
| 2009/0110953 A1 * | 4/2009 | Margolies | C23C 4/18 |
| | | | 428/621 |
| 2009/0136781 A1 * | 5/2009 | Damani | C23C 4/12 |
| | | | 428/702 |
| 2009/0250153 A1 * | 10/2009 | Meschter | C04B 41/009 |
| | | | 156/60 |
| 2012/0175889 A1 * | 7/2012 | Iijima | F01K 7/16 |
| | | | 290/1 R |
| 2014/0094356 A1 * | 4/2014 | Lau | C23C 18/1225 |
| | | | 501/108 |
| 2014/0193760 A1 | 7/2014 | Nelson et al. | |

OTHER PUBLICATIONS

U.S. Appl. No. 14/857,912, filed Sep. 18, 2015, Richard Todd Everhart.

* cited by examiner

TREATMENT PROCESS, REJUVENATION PROCESS, TREATMENT COMPOSITION, AND TREATED COMPONENT

CROSS REFERENCE TO RELATED APPLICATIONS

This application is a continuation-in-part of, and claims the benefit of, U.S. patent application Ser. No. 14/857,912, filed Sep. 18, 2015, entitled "Treatment Process, Oxide-Forming Treatment Composition, and Treated Component," the disclosure of which is incorporated by reference in its entirety.

FIELD OF THE INVENTION

The present invention is directed to manufactured components and treating of manufactured components. More specifically, the present invention is directed to treatment processes, treatments, and treated components for resisting corrosive attack.

BACKGROUND OF THE INVENTION

Modern high-efficiency combustion turbines have firing temperatures that exceed about 2000° F. (1093° C.), and firing temperatures continue to increase as demand for more efficient engines continues. Many components that form the combustor and "hot gas path" turbine sections are directly exposed to aggressive hot combustion gases, for example, the combustor liner, the transition duct between the combustion and turbine sections, and the turbine stationary vanes and rotating blades and surrounding ring segments. In addition to thermal stresses, these and other components are also exposed to mechanical stresses and loads that further wear on the components.

Many of the cobalt-based and nickel-based superalloy materials traditionally used to fabricate the majority of combustion turbine components used in the hot gas path section of the combustion turbine engine are insulated from the hot gas flow by coating the components with a thermal barrier or metallic overlay coating in order to survive long-term operation in this aggressive high-temperature combustion environment.

Thermal barrier coating systems often consist of four layers: the metal substrate, metallic bond coat, thermally grown oxide, and ceramic topcoat. The ceramic topcoat is typically composed of yttria-stabilized zirconia (YSZ), which is desirable for having very low thermal conductivity while remaining stable at nominal operating temperatures typically seen in applications. Such ceramic topcoats can be expensive to apply and/or limited in application methodology.

YSZ is a well known material used to improve the performance of metals used in high temperature applications. The YSZ is applied, typically by a high temperature thermal spray coating process. The YSZ increases the operating temperature of the high temperature substrate metal. In addition, a bond coat is applied between the YSZ and the high temperature metal reducing the thermal expansion mismatch between the YSZ and the high temperature metal, which improves the spallation resistance.

Certain ceramic topcoats are formed as abradable topcoats. Abradable topcoats may be included on components which contact other components, in some cases at high-rotational velocities. Abradable topcoats permit contact between the components while minimizing damage caused by inter-component contact and coating spallation. Topcoats may be adjusted to be abradable by forming the topcoat as a dense vertically cracked layer.

Gas turbine engines can be operated using a number of different fuels. These fuels are combusted in the combustor section of the engine at temperatures at or in excess of 2000° F. (1093° C.), and the gases of combustion are used to rotate the turbine section of the engine, located aft of the combustor section of the engine. Power is generated by the rotating turbine section as energy is extracted from the hot gases of combustion. It is generally economically beneficial to operate the gas turbine engines using the most inexpensive fuel available. One of the more abundant and inexpensive petroleum fuels is crude oil fuel. One of the reasons that crude oil fuel is an economical fuel is that it is not heavily refined. Not being heavily refined, it contains a number of impurities. One of these impurities is vanadium, which forms vanadium oxide ($V_2O_5$) at the high temperatures of combustion. Even though MgO is added as a fuel additive and acts as an inhibitor for reaction of vanadium species that forms an inert magnesium vanadate compound on or near the outer surface of the thermal barrier coating, MgO does not completely prevent the attack of YSZ thermal barrier coatings, as vanadium oxide can penetrate microcracks and porosity in the thermal barrier coatings, in particular the vertical cracks of a dense vertically cracked abradable topcoat, providing access not only to the YSZ thermal barrier coating, but also the underlying bond coat. $V_2O_5$ is an acidic oxide that can leach yttria from YSZ in cracks and porosity that occur in such thermal barrier coatings. The mechanism of attack is provided by the following reaction:

$$ZrO_2(Y_2O_3) + V_2O_5 \rightarrow ZrO_2(\text{monoclinic}) + 2YVO_4$$

Thus, $V_2O_5$ maintains the ability to rapidly attack YSZ, causing it to deteriorate and be removed by the hot gas stream. The loss of the TBC exposes the substrate metal and any remaining bond coat to the hot gases of combustion at elevated temperatures. At these elevated temperatures, the substrate metal and the bond coat are subject to corrosion from the hot gases of combustion, which shorten their life. As a result, the components, such as combustors and turbine blades, must be replaced in shorter intervals, which also means additional maintenance time for the turbine during which time it is not producing power. Due to such drawbacks, crude oil fuel has been used in steam boilers having inexpensive components that can be discarded regularly.

The drawbacks of using crude oil fuel can be partially overcome by modifying the composition of the ceramic coating in a gas turbine. For example, gadolinium zirconate can be used instead of YSZ. Although such ceramic coatings resist corrosive attack from calcium-magnesium-aluminosilicate (CMAS), they do not resist corrosive attack from vanadium. In addition, use of gadolinium zirconate alters physical properties in comparison to use of YSZ.

Corrosive attack from vanadium can initially be reduced or eliminated by adding additional layers to a coating system. For example, adding an impermeable barrier layer to YSZ can initially reduce or eliminate corrosive attack from vanadium in HFO. Likewise, laser glazing a top surface of YSZ to form a seal can initially reduce or eliminate corrosive attack from vanadium in crude oil fuel. However, such additional layers can increase cracking tendency upon thermal expansion/contraction associated with operation of a gas turbine, and may inhibit the abradable qualities of an abradable topcoat. This cracking can compromise the additional layer, the YSZ, and/or other layers within the coating system, thereby leading to corrosive attack.

BRIEF DESCRIPTION OF THE INVENTION

In an exemplary embodiment, a treatment process for a gas turbine component including an abradable ceramic coating includes contacting the abradable ceramic coating with a treatment composition. The treatment composition includes a carrier and a sacrificial oxide-forming material suspended within the carrier. The sacrificial oxide-forming material is selected from the group consisting of tin oxide, magnesium oxide, antimony pentaoxide, and combinations thereof. The sacrificial oxide-forming material is infused into the abradable ceramic coating to form sacrificial oxide-forming deposits within the abradable ceramic coating.

In another exemplary embodiment, a rejuvenation process includes contacting a hot gas path surface of a gas turbine component with a rinse composition comprising water. The hot gas path surface includes an abradable ceramic coating. The hot gas path surface of the gas turbine component is contacted with a treatment composition. The treatment composition includes a carrier and a sacrificial oxide-forming material suspended within the carrier. The sacrificial oxide-forming material is selected from the group consisting of tin oxide, magnesium oxide, antimony pentaoxide, and combinations thereof. The sacrificial oxide-forming material is infused into the abradable ceramic coating to form sacrificial oxide-forming deposits within the abradable ceramic coating.

In another exemplary embodiment, a treatment composition includes a carrier and a sacrificial oxide-forming material suspended within the carrier. The sacrificial oxide-forming material is selected from the group consisting of tin oxide, magnesium oxide, antimony pentaoxide, and combinations thereof.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided are an exemplary treatment process, rejuvenation process, treatment composition, and treated component that do not suffer from one or more of the above drawbacks. Embodiments of the present disclosure reduce or eliminate leaching of ceramic coating constituents (for example, from vanadium compounds), reduce or eliminate corrosive effect of combusting crude oil fuels in gas turbines, permit use of higher firing temperatures in gas turbines thereby permitting higher efficiency, extend the usable life of hot gas path components in gas turbines, protect coatings system layers (for example, metal substrates, metallic bond coat, thermally grown oxide, ceramic topcoats, and combinations thereof), expand the usefulness of yttria-stabilized zirconia (YSZ) coatings, increase thermal expansion/contraction resistance, or combinations thereof.

Figure 1:
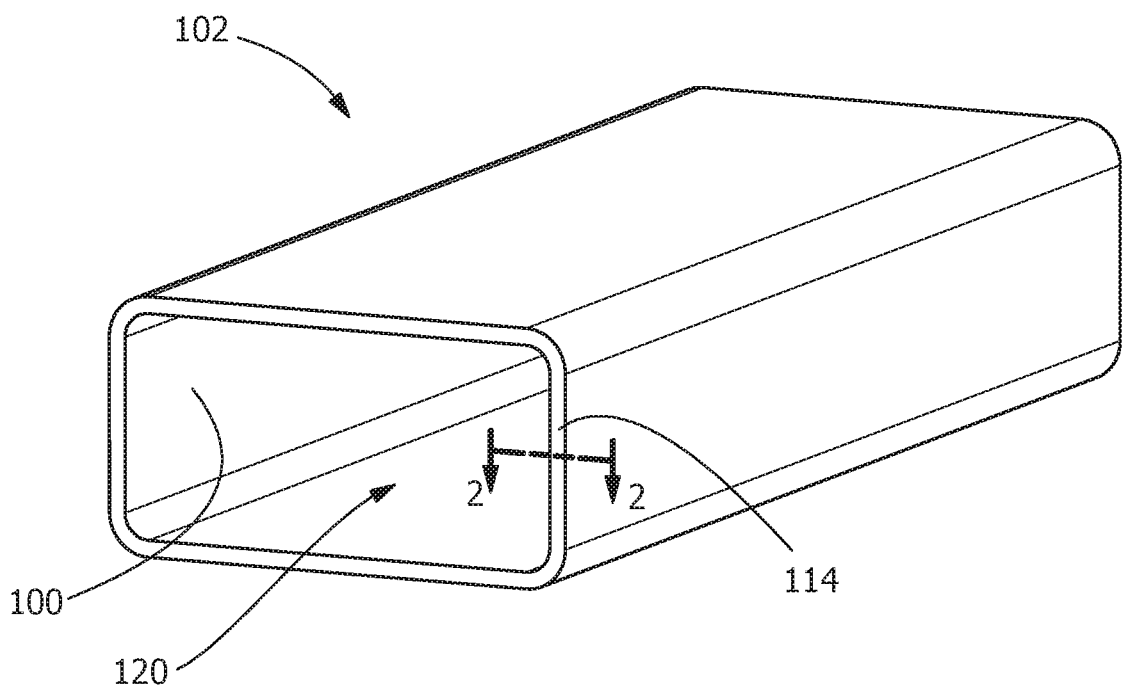
FIG. 1 is a schematic view of an exemplary component treated by an exemplary treatment process, according to the disclosure.

FIG. 1 shows a component 102 with a coating system 100 disposed on a substrate 114. The coating system 100 is positioned on any suitable portion of the component 102. As shown in FIG. 1, in one embodiment, the coating system 100 is on an interior portion 120 of the component 102, such as along a hot gas path. In other embodiments, the coating system 100 is disposed on portions of the component 102 that are not interior portions or are not within a hot gas path. The component 102 is any suitable component that is exposed to high temperature gases. For example, in one embodiment, the component 102 is a combustor. In a further embodiment, the component 102 is a liner for a combustor of a gas turbine. In other embodiments, the component 102 is a stationary or rotating air foil, a shroud (for example, a stationary shroud) or a stationary hot gas path nozzle.

Figure 2:
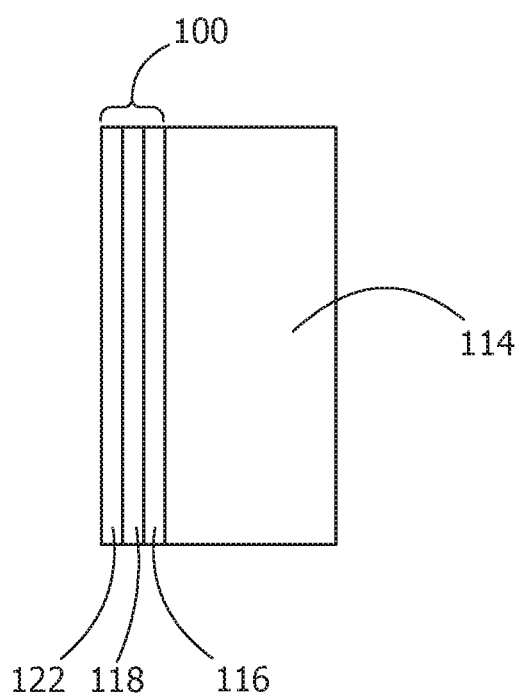
FIG. 2 is a schematic sectional view of the component of FIG. 1 taken in direction 2-2.

In one embodiment, the coating system 100 includes a substrate 114, a metallic bond coating 116 such as a MCrAlY coating, a ceramic layer 118 and an oxide overlay coating 122 (see, for example, FIG. 2). As used herein, the term "MCrAlY" refers to a composition having chromium, aluminum, yttrium, and M, where M is a metal or alloy selected from the group consisting of nickel metal, iron metal, cobalt metal, and combinations thereof. In one embodiment, the substrate 114 is an alloy containing iron, nickel, cobalt, titanium, and other suitable components. Suitable alloy compositions include nickel and cobalt-based superalloys. In one embodiment, the substrate 114 has a composition, by weight, about 0.1% C, about 22% Cr, about 9% Mo, about 0.5% W, about 1% Co, about 19% Fe, and a balance Ni. In one embodiment, the substrate 114 has a composition, by weight, of between about 0.15% and about 0.19% C, between about 13.7% and about 14.3% Cr, between about 9.0% and 10.0% Co, between about 4.8 and about 5.2% Ti, between about 2.8% and about 3.2% Al, between about 3.7% and about 4.3% W, between about 3.7% and about 4.3% Mo, at least about 7.7% W and Mo, and a balance Ni. In one embodiment, the substrate 114 has a composition, by weight, of between about 50% and about 55% Ni, between about 17% and about 21% Cr, between about 4.7% and about 5.5% Nb/Ta, between about 2.8% and about 3.3% Mo, between about 0.65% and about 1.2% Ti, between about 0.20% and about 0.80% Al, up to about 1.0% Co, up to about 0.08% C, up to about 0.35% Mn, up to about 0.35% Si, up to about 0.015% P, up to about 0.015% S, up to about 0.006% Bo, up to about 0.30% Cu, and a balance Fe.

The bond coating 116 adheres the ceramic layer 118 to the substrate 114. In one embodiment, the MCrAlY coating 116 is a metal or alloy selected from the group consisting of a platinum metal, an iridium metal, an iridium-hafnium metal, an iridium-platinum metal, a platinum-rhenium metal, a platinum-based alloy, iridium-based alloy, an iridium-hafnium-based alloy, an iridium-platinum-based alloy, a platinum-rhenium-based alloy, and combinations thereof. In one embodiment, the MCrAlY coating 116 has a thickness of about 2 mils, about 4 mils, about 6 mils, about 10 mils, about 15 mils, between about 2 mils and about 4 mils, between about 4 mils and about 6 mils, between about 6 mils and about 10 mils, between about 10 mils and about 15 mils, or any suitable combination, sub-combination, range, or sub-range within.

The ceramic layer 118 is positioned on the MCrAlY coating 116 and protects the substrate 114 from high temperatures, such as in a hot gas path of the component 102. Other layers may be present between the ceramic layer 118 and bond coating 116, such as thermally grown oxide layers or other known layers typically utilized in thermal barrier coating systems. In one embodiment, the ceramic layer 118 includes yttria-stabilized zirconia. In one embodiment, the ceramic layer 118 has a thickness of about 1 mil, about 2 mils, about 3 mils, about 4 mils, about 5 mils, between about 1 mil and about 2 mils, between about 1 mil and about 3 mils, between about 1 mil and about 5 mils, between about 2 mils and about 3 mils, between about 3 mils and about 4 mils, between about 20 mils and about 40 mils (for example, as in combustor and stationary shrouds), greater than about 40 mils, between about 5 mils and about 20 mils (for example, as in air foils), or any suitable combination, sub-combination, range, or sub-range within.

Sacrificial oxide-forming deposits 122 are disposed on and within the ceramic layer 118. The sacrificial oxide-forming deposits 122 may be formed from heating the treatment composition 104. The sacrificial oxide-forming deposits 122 contains at least one oxide material that reduces or eliminates corrosive and/or damaging effects, particularly from the presence of vanadium, of combusting crude oil fuels in gas turbines. The treatment composition 104 includes a sacrificial oxide-forming material suspended within a carrier. The sacrificial oxide-forming material may be any suitable material, including, but not limited to, tin oxide, magnesium oxide, antimony pentaoxide, or combinations thereof. Suitable forms for the treatment composition 104 include, but are not limited to, a solution (for example, in water), a colloidal suspension, a gel, a sol, a vapor, or combinations thereof.

In one embodiment, the treatment composition 104 penetrates portions of the ceramic layer 118 and/or the MCrAlY coating 116 and forms sacrificial oxide-forming deposits 122. For example, in one embodiment, the sacrificial oxide-forming deposits 122 infuses into cracks, pores, asperities, machined features, delaminations, or combinations thereof. In one embodiment, the sacrificial oxide-forming deposits 122 are resistant to corrosion and/or provides protection from vanadium attack, such as attack resulting from the use of vanadium containing fuel. In another embodiment, the sacrificial oxide-forming deposits 122 are resistant to corrosive attack from sulfur compounds, sodium compounds, phosphorus compounds, vanadium compounds, or combinations thereof.

Figure 3:
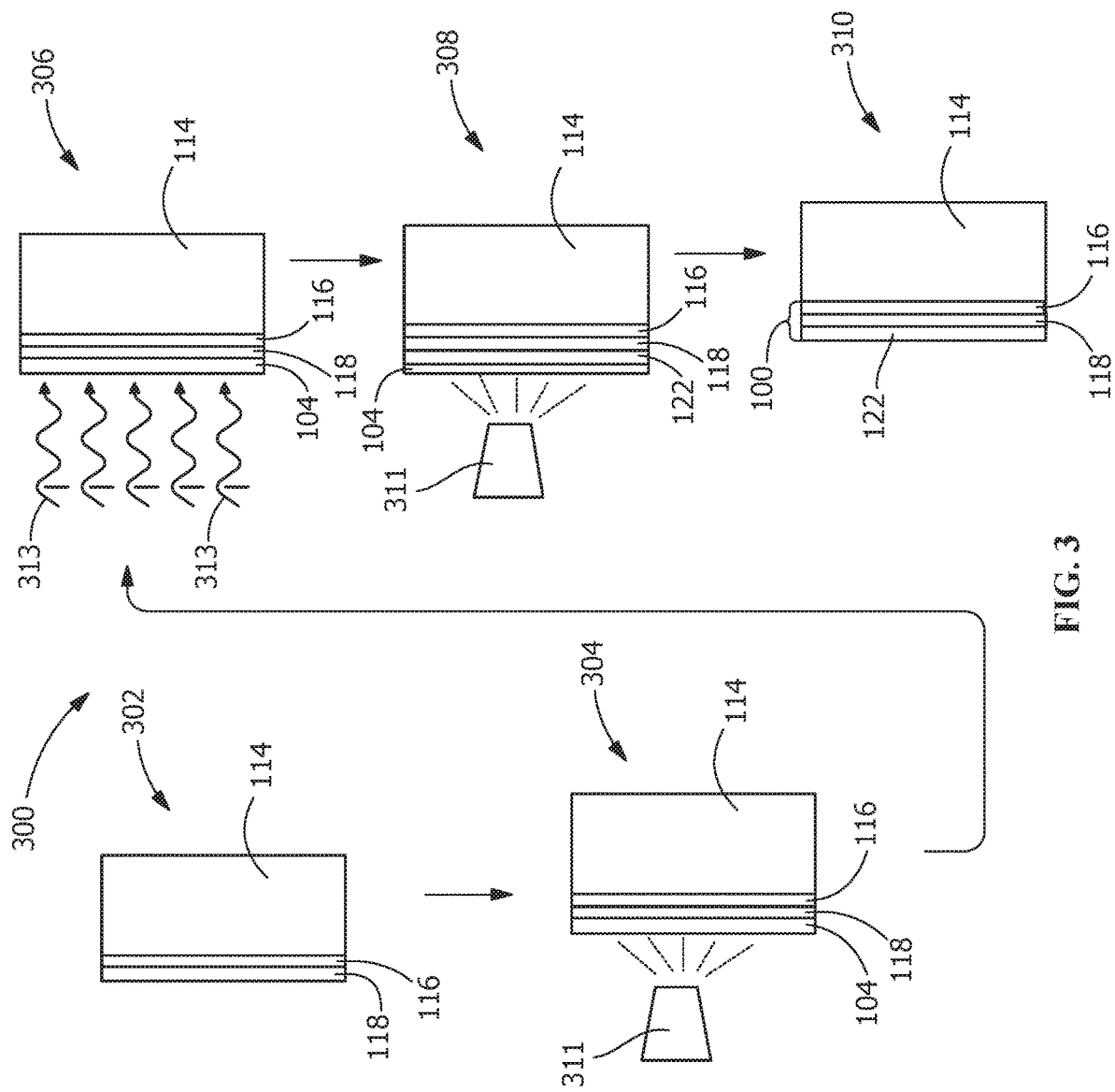
FIG. 3 is a schematic view of an exemplary treatment process, according to the disclosure.

FIG. 3 schematically shows a process 300, according to the present disclosure. As shown in FIG. 3, a substrate having a bond coating 116 and a ceramic layer 118 is provided (step 302). Although not shown, other known layers, such as thermally grown oxide layers, may also be present. Process 300, as shown in FIG. 3, includes applying the treatment composition 104 by spraying with a spray apparatus 311 (step 304), heating the treatment composition 104 with an external heat source 313 (step 306), and optionally reapplying the treatment composition 104 with a spray apparatus 311 (step 308). In the embodiment wherein the treatment composition is reapplied, the treatment composition may be heated again, as in step 306, or may be placed into service, wherein heat is applied during operation of the component. Upon applying the treatment composition 104 (step 304) and heating the treatment composition 104 (step 306), sacrificial oxide-forming deposits 122 are formed within the coating system 100, thereby forming a treated component 102.

Figure 4:
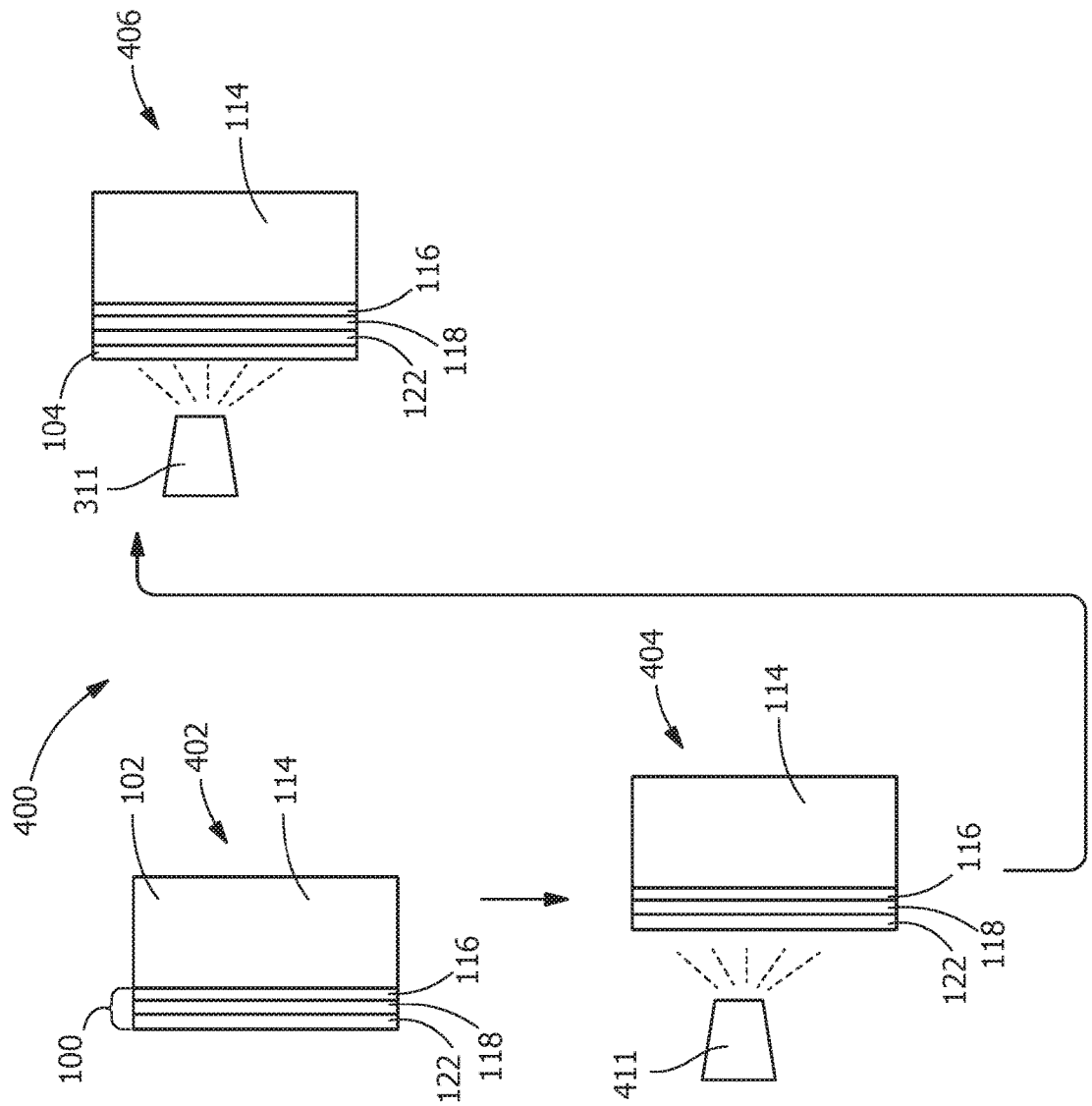
FIG. 4 is a schematic view of an exemplary rejuvenation process, according to the disclosure.

As shown in FIG. 4, in another embodiment, a rejuvenation process 400 may be provided wherein a component 102 having a coating system 100 including a substrate 114, bond coating 116, a ceramic layer 118 and sacrificial oxide-forming deposits 122, is removed from service (step 402). The component having the coating system 100 is then cleaned and/or rinsed, such as by contact with an aqueous solution with a rinse nozzle 411 (step 404). Although FIG. 4 shows a coating system 100 with sacrificial oxide-forming deposits 122, the rejuvenation method 400, according to the present disclosure, may include a coating system 100 having damaged sacrificial oxide-forming deposits 122 or a surface that is devoid of sacrificial oxide-forming deposits 122. Thereafter, the rejuvenation process 400 includes applying a treatment composition 104 to the component 102 with a spray apparatus 311 (step 406). Although not shown in FIG. 4, after application of the treatment composition 104, the component 102 is returned to service and the treatment composition 104 may be heated during operation to form sacrificial oxide-forming deposits 122. In another embodiment, the component 102 is heated, such as in step 306 of FIG. 3, prior to being placed into operation to form sacrificial oxide-forming deposits 122.

Although the treatment composition 104 is shown to be applied by spraying in FIGS. 3 and 4 (step 304, optionally step 308 and step 406), the treatment composition 104 may be applied by any suitable technique. Suitable techniques include application processes selected from the group consisting of brushing, injecting, condensing, dipping, spraying (for example, aerosol spraying), and combinations thereof. In one embodiment, the treatment composition is applied at a suitable application temperature. Suitable application temperatures, for example, for brushing, injecting, dipping, and/or spraying, are between about 32° F. and about 212° F. between about 40° F. and about 120° F., between about 60° F. and about 100° F., between about 70° F. and about 80° F., at about 70° F., at about 75° F., or any suitable combination, sub-combination, range, or sub-range within). Suitable application temperatures, for example, for condensing, are greater than about 212° F.

Referring again to FIG. 2, in one embodiment, wherein the component 102 is a component, such as a shroud, subject to contact with other components, the ceramic layer 118 is an abradable coating, such as, but not limited to, a dense vertically cracked layer. The dense vertically cracked abradable ceramic layer 118 may include any suitable composition, including, but not limited to, a ceramic oxide stabilized by a rare earth element, such as, but not limited to, yttrium, ytterbium, gadolinium, neodymium, or a combination thereof. In one embodiment, the dense vertically cracked abradable ceramic layer 118 includes yttria stabilized zirconia. In a further embodiment, the yttria stabilized zirconia includes about 7 to about 8 wt % yttria. In another further embodiment, the yttria stabilized zirconia includes about 18 to about 20 wt % yttria.

In one embodiment for a component such as a shroud, subject to contact with other components, for either or both of the treatment process of FIG. 3 300 and the rejuvenation process 400 of FIG. 4, contacting the ceramic layer 118 with the treatment composition 104 infuses sacrificial oxide forming material into the ceramic layer 118, forming sacrificial oxide-forming deposits 122 within the ceramic layer 118 in addition to, or in lieu of forming the sacrificial oxide-forming deposits 122 on the ceramic layer 118 (as shown in FIG. 2). In a further embodiment, contacting the ceramic layer 118 with the treatment composition 104, wherein the ceramic layer 118 is an abradable layer having a dense vertically cracked structure, includes infusing sacrificial oxide forming material into the dense vertically cracked structure of the abradable ceramic layer 118, forming sacrificial oxide-forming deposits 122 within the abradable ceramic layer 118. Infusing the sacrificial oxide forming material into the dense vertically cracked structure of the abradable ceramic layer 118 may include drawing the sacrificial oxide forming material into the dense vertically cracked structure of the abradable ceramic layer 118 by capillary action, forming the sacrificial oxide-forming deposits 122 within the dense vertically cracked structure of the abradable ceramic layer 118. In one embodiment, the sacrificial oxide-forming deposits 122 within the dense vertically cracked structure of the abradable ceramic layer 118 are a thin layer coating the cracks of the dense vertically cracked structure.

In one embodiment, the dense vertically cracked abradable ceramic layer 118 may include a plurality of phases. In a further embodiment, the dense vertically cracked abradable ceramic layer 118 includes at least one phase of yttria stabilized zirconia having about 7 to about 8 wt % yttria and another phase of yttria stabilized zirconia having about 18 to about 20 wt % yttria. The phases may be arranged in any suitable order. In one embodiment, the phase of yttria stabilized zirconia having about 7 to about 8 wt % yttria is disposed adjacent to the metallic bond coating 116 and the phase of yttria stabilized zirconia having about 18 to about 20 wt % yttria is separated from the metallic bond coating 116 by the phase of yttria stabilized zirconia having about 7 to about 8 wt % yttria. In an alternate embodiment, the phase of yttria stabilized zirconia having about 18 to about 20 wt % yttria is disposed adjacent to the metallic bond coating 116 and the phase of yttria stabilized zirconia having about 7 to about 8 wt % yttria is separated from the metallic bond coating 116 by the phase of yttria stabilized zirconia having about 18 to about 20 wt % yttria. The dense vertically cracked abradable ceramic layer 118 may include more than two phases of yttria stabilized zirconia.

In one embodiment, the sacrificial oxide-forming deposits 122 are infused into only the exterior phase of yttria stabilized zirconia. In another embodiment, the sacrificial oxide-forming deposits 122 are infused into at least two phases of yttria stabilized zirconia. In yet another embodiment, the sacrificial oxide-forming deposits 122 are infused throughout the dense vertically cracked abradable ceramic layer 118.

In one embodiment, the treatment composition 104 is heated (step 306) to a heating temperature (for example, between about 800° F. and about 1200° F., between about 800° F. and about 1000° F., between about 1000° F. and about 1200° F., between about 900° F. and about 1100° F., at about 900° F., at about 1000° F., at about 1100° F., or any suitable combination, sub-combination, range, or sub-range within). In one embodiment, the heating is for a heating period, for example, between about 10 minutes and about 20 minutes, between about 10 minutes and about 15 minutes, between about 15 minutes and about 20 minutes, about 10 minutes, about 15 minutes, about 20 minutes, or any suitable combination, sub-combination, range, or sub-range within. In one embodiment, a lower temperature (for example, less than about 800° F.) is used with a longer duration of the heating (for example, one or two days).

In one embodiment, the treatment composition 104 is heated (step 306) by an external heating source, for example, electrically-heated air, an infrared lamp, a quartz lamp, a flame, a thermal spray torch, or any other suitable heating mechanism. In one embodiment, the treatment composition 104 is heated (step 306) by the component 102 being placed into operation, for example, by positioning the component 102 into or as a portion of a gas turbine (not shown) and the gas turbine being operated.

In one embodiment, the treatment composition 104 is reapplied (process 400), for example, after use/operation of the component 102. In one embodiment, with the component 102 being positioned in or as a portion of a gas turbine, the treatment composition 104 is reapplied (step 308) periodically over the life of the component 102.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A treatment process for a gas turbine component comprising an abradable ceramic coating, the process comprising:
   contacting the abradable ceramic coating with a treatment composition, the treatment composition consisting of a carrier and a sacrificial oxide-forming material suspended within the carrier, the sacrificial oxide-forming material being selected from the group consisting of tin oxide, magnesium oxide, antimony pentaoxide, and combinations thereof; and
   infusing the sacrificial oxide-forming material into the abradable ceramic coating to form sacrificial oxide-forming deposits disposed within the abradable ceramic coating.

2. The treatment process of claim 1, wherein the abradable ceramic coating is within a hot-gas path of the gas turbine.

3. The treatment process of claim 1, wherein the contacting includes applying the treatment composition by a technique selected from the group consisting of brushing, dipping, injecting, condensing, spraying, and combinations thereof.

4. The treatment process of claim 1, further comprising heating the treatment composition to a temperature of between about 800° F. and about 1200° F.

5. The treatment process of claim 1, wherein infusing the sacrificial oxide-forming material into the abradable ceramic coating includes infusing the sacrificial oxide-forming material into a dense vertically cracked structure of the abradable ceramic coating.

6. The treatment process of claim 1, wherein infusing the sacrificial oxide-forming material into the abradable ceramic coating includes infusing the sacrificial oxide-forming material into regions of the ceramic coating selected from the group consisting of cracks, pores, asperities, machined features, delaminations, and combinations thereof.

7. The treatment process of claim 1, further comprising operating the gas turbine then reapplying the treatment composition and heating the treatment composition.

8. The treatment process of claim 1, further comprising operating the gas turbine with a crude oil fuel.

9. A rejuvenation process, comprising;
contacting a hot gas path surface of a gas turbine component with a rinse composition comprising water, the hot gas path surface including an abradable ceramic coating;
contacting the hot gas path surface of the gas turbine component with a treatment composition, the treatment composition consisting of a carrier and a sacrificial oxide-forming material suspended within the carrier, the sacrificial oxide-forming material being selected from the group consisting of tin oxide, magnesium oxide, antimony pentaoxide, and combinations thereof; and
infusing the sacrificial oxide-forming material into the abradable ceramic coating to form sacrificial oxide-forming deposits disposed within the abradable ceramic coating.

10. The rejuvenation process of claim 9, wherein infusing the sacrificial oxide-forming material into the abradable ceramic coating includes infusing the sacrificial oxide-forming material into a dense vertically cracked structure of the abradable ceramic coating.

11. The rejuvenation process of claim 9, wherein infusing the sacrificial oxide-forming material into the abradable ceramic coating includes infusing the sacrificial oxide-forming material into regions of the ceramic coating selected from the group consisting of cracks, pores, asperities, machined features, delaminations, and combinations thereof.

12. The rejuvenation process of claim 9, wherein the contacting includes applying the treatment composition by a technique selected from the group consisting of brushing, dipping, injecting, condensing, spraying, and combinations thereof.

13. The rejuvenation process of claim 9, further comprising heating the treatment composition to a temperature of between about 800° F. and about 1200° F.

14. The rejuvenation process of claim 9, further comprising operating the gas turbine then reapplying the treatment composition and heating the treatment composition.

15. The rejuvenation process of claim 9, further comprising operating the gas turbine with a crude oil fuel.

16. A component treated with the treatment process of claim 1, the component comprising:
an abradable ceramic coating on a substrate; and
sacrificial oxide-forming deposits disposed within the abradable ceramic coating, the sacrificial oxide-forming deposits being selected from the group consisting of tin oxide, magnesium oxide, antimony pentaoxide, and combinations thereof.

17. The treated component of claim 16, wherein the ceramic coating is within a hot-gas path of a gas turbine.

* * * * *